(12) United States Patent
Barri et al.

(10) Patent No.: US 7,506,081 B2
(45) Date of Patent: Mar. 17, 2009

(54) SYSTEM AND METHOD OF MAINTAINING HIGH BANDWIDTH REQUIREMENT OF A DATA PIPE FROM LOW BANDWIDTH MEMORIES

(75) Inventors: Peter Irma August Barri, Bonheiden (BE); Jean Louis Calvignac, Cary, NC (US); Kent Harold Haselhorst, Byron, MN (US); Marco C. Heddes, Cary, NC (US); Joseph Franklin Logan, Raleigh, NC (US); Fabrice Jean Verplanken, La Gaude (FR); Miroslav Vrana, Gent (BE)

(73) Assignee: International Business Machines Corporation, Armonk, NY (US)

( * ) Notice: Subject to any disclaimer, the term of this patent is extended or adjusted under 35 U.S.C. 154(b) by 660 days.

(21) Appl. No.: 10/850,219

(22) Filed: May 20, 2004

(65) Prior Publication Data

US 2004/0215903 A1 Oct. 28, 2004

Related U.S. Application Data

(60) Division of application No. 09/990,840, filed on Nov. 21, 2001, and a continuation-in-part of application No. 09/384,744, filed on Aug. 27, 1999, now Pat. No. 6,460,102.

(60) Provisional application No. 60/253,869, filed on Nov. 29, 2000.

(51) Int. Cl.
*G06F 3/00* (2006.01)

(52) U.S. Cl. ...................................................... 710/36

(58) Field of Classification Search .................... 710/36; 711/148, 105, 154, 168
See application file for complete search history.

(56) References Cited

U.S. PATENT DOCUMENTS

| | | | | |
|---|---|---|---|---|
| 5,822,603 A | 10/1998 | Hansen et al. | ......... | 395/800.01 |
| 5,956,275 A | 9/1999 | Elliott et al. | ........... | 365/189.04 |
| 6,091,729 A * | 7/2000 | Dove | ....................... | 370/395.4 |
| 6,460,120 B1 | 10/2002 | Bass et al. | ................... | 711/148 |
| 6,560,227 B1 | 5/2003 | Bartoldus et al. | ........... | 370/390 |

OTHER PUBLICATIONS

ED Brooks III, KH Warren—Supercomputing, ACM/IEEE 1997 Conference, 1997.*

* cited by examiner

*Primary Examiner*—Tariq Hafiz
*Assistant Examiner*—Jasjit S Vidwan
(74) *Attorney, Agent, or Firm*—Joscelyn G. Cockburn; Anthony M. Del Zoppo, III; Driggs, Hogg, Daugherty & Del Zoppo Co., LPA

(57) ABSTRACT

A Network Processor includes a Fat Pipe Port and a memory sub-system that provides sufficient data to satisfy the Bandwidth requirements of the Fat Pipe Port. The memory sub-system includes a plurality of DDR DRAMs controlled so that data is extracted from one DDR DRAM or simultaneously from a plurality of the DDR DRAMs. By controlling the DDR DRAMs so that the outputs provide data serially or in parallel, the data Bandwidth is adjustable over a wide range. Similarly, data is written serially into one DDR DRAM or simultaneously into multiple DDR DRAMs. As a consequence buffers with data from the same frame are written into or read from different DDR DRAMs.

11 Claims, 5 Drawing Sheets

SYSTEM AND METHOD OF MAINTAINING HIGH BANDWIDTH REQUIREMENT OF A DATA PIPE FROM LOW BANDWIDTH MEMORIES

The present divisional application claims priority of application Ser. No. 09/990,840 filed Nov. 21, 2001 which claims priority of the Provisional Application filed on Nov. 29, 2000, Ser. No. 60/253,869. This is a continuation-in-part (CIP) of application Ser. No. 09/384,744, filed Aug. 27, 1999, entitled "Network Processor Memory Organization and Methods," now U.S. Pat. No. 6,460,102 B1 issued Oct. 1, 2002.

CROSS-REFERENCE TO RELATED PATENT APPLICATIONS

The present application claims priority of the Provisional Application (RAL920000112US1) filed on Nov. 29, 2000, Ser. No. 60/253,869. The present application relates to the following patent applications, assigned to the Assignee of the present invention, incorporated herein by reference: patent application Ser. No. 09/384,691, filed Aug. 27, 1999, by Brian M. Bass et al., entitled "Network Processor Processing Complex Methods"; patent application Ser. No. 09/384,744, filed Aug. 27, 1999, by Brian M. Bass et al., entitled "Network Processor, Memory Organization and Methods". This application is also a continuation in part (C-I-P) of application Ser. No. 09/384,744 filed Aug. 27, 1999 entitled "Network Processor Memory Organization and Methods" now U.S. Pat. No. 6,460,102 B1 issued Oct. 1, 2002.

BACKGROUND OF THE INVENTION

1. Field of the Invention

The present invention relates to communications network in general and in particular to devices used to transport large amounts of data in said networks.

2. Prior Art

The use of network devices such as switches, bridges, computers, networks processors etc., for transferring information within communications network is well known in the prior art. One of the requirements placed on these devices is the need for them to transport large volumes of data often referred to as bandwidth.

To meet the high bandwidth requirement the devices are provided with Fat Pipes. A Fat Pipe is a channel with high bandwidth which transmits large amounts of data.

In order to provide Fat Pipes with ample supply of data, high speed storage sub-systems are required. High speed storage systems such as Static Random Access Memories (SRAM) etc., can be used. But these memories are expensive and as a result increase the price of the devices in which they are used.

In addition to being expensive, the prior art high speed memories are low density. That is they can only store a limited amount of data. However, most applications especially those related to internet and other technologies require high density memories. A high density memory is one that is able to store and provide a large amount of data. As a consequence even the prior art high speed memories are not suitable for many applications.

In view of the above there is a need for high speed memories that are low cost and have high densities. As used in this document high speed memories have large Bandwidth (BW) providing large amounts of data in a relatively short time interval.

SUMMARY OF THE INVENTION

The invention stores (writes) data across multiple memory banks or slices and retrieves (reads) the stored data across the multiple memory banks. Preferably, the write/read activities are done simultaneously on different memory banks or slices. In addition, consecutive sectors of the same frame are spread over different memory slices which improves the effectiveness of the device (network processor) to handle long frames.

The apparatus and method according to the teachings of the present invention includes an arbiter accepting memory access requests for a plurality of separate memories from different entities. The arbiter prioritizes the requests and grants the highest priority to the transmitter controller entity, servicing a fat pipe port. As used herein a fat pipe is a high bandwidth port delivering data at a bandwidth greater than 10 Gbps. Even though the data bandwidth of each one of the plurality of separate memories is less than the bandwidth of the fat pipe port, the arbiter for each memory cycle causes data to be simultaneously read from different memories. As a consequence the total bandwidth of the read memories meets the bandwidth requirement of the Fat Pipe port.

In one feature of the invention a frame to be stored in memory is partitioned into predetermined parts. The arbiter stores adjacent parts of the same frame in different memory elements.

In another feature of the invention, memories that are not requested to be used by the transmitter controller is made available to other entities requesting memory use during a particular memory cycle.

A better understanding of the features and advantage of the present invention will be obtained by reference to the following detailed description and accompanying drawings which set forth an illustrative embodiment in which the principles of the inventions are used.

Among the benefits and advantages of the present invention is that it allows relatively slow but high density memories, such as DRAMs, to be used in high speed applications without increasing the overall device cost as would have resulted if high speed low density memories were used.

DETAILED DESCRIPTION OF THE PREFERRED EMBODIMENT

Figure 1:
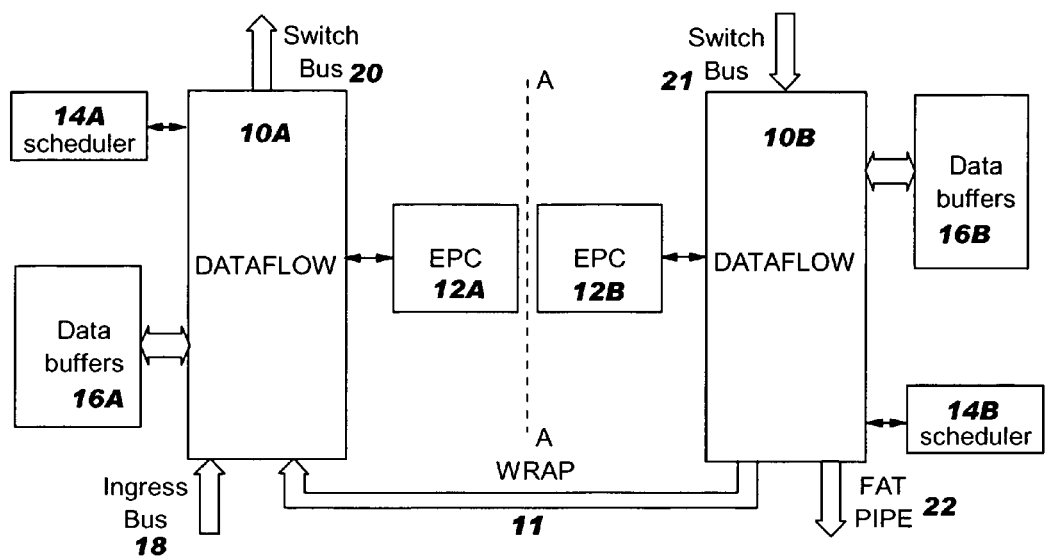
FIG. 1 shows a block diagram of a Network Processor (NP) including the teachings of the present invention.

FIG. 1 shows a block diagram of a network processor in which the invention according to the teaching of the present invention is embedded. Even though the present invention can be used in any technology in which data has to be stored and transmitted with sufficient BandWidth (BW) to support a FAT PIPE. As used herein a FAT Pipe is a high speed or high bandwidth data channel. It works well in the Network Processor environment and as such will be described in this environment. However, this should not be construed as a limitation on the scope of the present invention since it is well within the skill of one skilled in the art to make minor changes or no changes to adapt the teachings to other technologies.

Still referring to FIG. 1, the Network Processor includes data flow chips 10A, 10B, embedded processor complexes (EPC) 12A, 12B, scheduler chips 14A, 14B, data buffers 16A and 16B. The data flow chip 10A, scheduler chip 14A, EPC chip 12A and data buffers 16A are coupled as shown in the figure and positioned on the left hand side of an imaginary axis labeled AA. Likewise, data flow chip 10B, EPC chip 12B, data buffers 16B, and scheduler chip 14B are coupled as shown in the figure and positioned on the right hand side of imaginary line AA. As seen in FIG. 1, the right hand side of the network processor and the left hand side are symmetrical. Wrap channel 11 provides a transmission path from Data Flow Chip 10B to Data Flow Chip 10A.

Still referring to FIG. 1 the left hand side of the network processor is referred to as the Ingress side whereas the right hand side is referred to as the Egress side. Ingress bus 18 transports data at high speeds from a communication network not shown into data flow chip 10A. The communications network could be a Local Area Network (LAN), public switch network (PSN), internet etc. These types of communication networks are well known and further discussion will not be given. The output from data flow chip 10A is fed in cell size chunks over switch bus 20. A cross point switch such as the IBM® PowerPRS28.4G switching fabric (PRIZMA) (not shown) accepts data from switch bus 20, processes the data and outputs the data on switch bus 21. A FAT pipe 22 is connected to a FAT port (not shown). The Data Flow chip 10B coacts with the data buffers 16B (discussed in more detail hereinafter) to provide high speed data to the FAT port of the network processor. From the FAT port high speed data is transmitted by the FAT pipe 22.

Still referring to FIG. 1, when the network processor is operatively coupled to a communications network the Network Processor functions as follows. An HDLC frame extracted from Sonet/SDH stream by framer device (not shown) is received on Ingress bus 18 of the Data Flow chip 10A. The data is written into data buffers 16A, hereafter termed ingress data store memory. Once a complete frame has been written into the data store memory the frame control block (FCB) is enqueued into one of the Embedded Processor Complex EPC queues (G-FIFO) FIG. 2. The EPC chip reads out the frame pointers and processes the respective frame in one of its picoprocessors. As is described in patent application Ser. No. 09/384,691, incorporated herein by reference, the EPC has a plurality of picoprocessors, each one optimized to perform specific tasks. During frame processing EPC can issue requests for reading/writing the appropriate parts of the frame (e.g. L2 and L3 headers) from/to the data store. After frame processing is completed, the EPC passes the frame context to the data flow chip which enqueues frame into the queuing structure of the scheduler chip 14A. The scheduler in the scheduler chip selects the frame from appropriate queue for transmission, which means that the corresponding frame pointer is passed to the data flow chip. The transmitted frame is read out from the ingress data buffer and it is transmitted on the switch interface in the form of PRIZMA, a crosspoint switch marketed by IBM® Corporation, cells.

Still referring to FIG. 1, in the Egress direction PRIZMA cells are received from the Switch bus 21 and the frame is reassembled in the Egress data buffers 16B. After receiving a complete frame, the frame pointer is enqueued for processing in EPC queues. Egress EPC 12B retrieves the frame context from the data flow chip and processes a frame header in the picoprocessor. The results of the processing of the frame context is passed to the data flow chip. Data flow chip enqueues the frame in appropriate queue of the scheduler 14B. The scheduler selects the frame to be transmitted and this is then read out from the data buffers 16B and transmitted online from the interface of the data flow chip.

Figure 2:
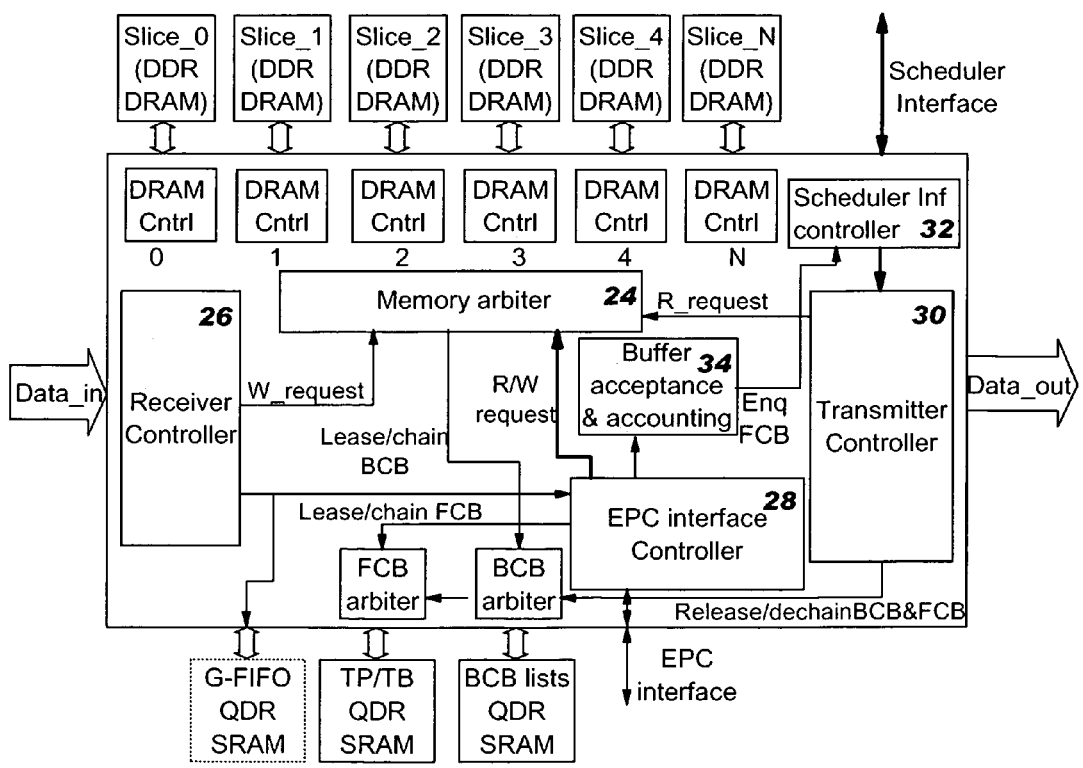
FIG. 2 shows a block diagram of the Data chip and memory sub-system according to the teachings of the present invention.

FIG. 2 shows a block diagram of the data flow chip. It should be noted that the components in FIG. 1 which are labeled with the same numeral are identical. The description of one is intended to cover the description of the other having like numeral. To this end data flow chip 10A and 10B are identical. As a consequence, the Data Flow Chip can be used on either the Ingress side or the Egress side of the network processor. Therefore, in FIG. 2 the In Bus and Out Bus are termed data-in and data-out. If the data flow chip is on the Ingress side of the network processor, data-in would be line data on ingress bus 18 whereas data-out would be cell size pieces of information outputted on the switch bus 20. If the data flow chip is used as 10B on the Egress side of the network processor, then data-in would be the cell size pieces of information received on switch bus 21 whereas the data-out would be the high speed data received from the FAT port onto FAT pipe 22. Depending on the bandwidth of the FAT pipe an additional port could be connected to the Data Flow Chip.

In order to meet this multiplicity of use the data flow chip can be configured into line mode or switch mode. The mode configuration depends on whether it is in the Ingress part of the network processor or the Egress part. The chip is unidirectional. The main function of the chip is data flow including buffer management. The functional characteristic may be summarized as follows:

Receiving frame from line/switch interface (10 Gbps/14.3 Gbps) and writing frame data into data store memory Transmitting frame on switch/line interface (14.3 Gbps/10 Gbps); please note that the frames are transmitted on switch interface in form of PRIZMA cells.

Providing R/W accesses to data store for EPC in order to allow IP header processing including frame modification Providing the loop for data and control traffic from DataFlow_egress to DataFlow_ingress by means of WRAP interface Performing all buffer management functions including buffer acceptance based on RED, WRED ((W)RED drop probabilities may be calculated on chip, without EPC intervention) and SRED.

Performing accounting of buffer filling level on per target blade (port) and per priority basis and transferring this information on switch interface Performing frame alteration commands encoded in frame context and issued by EPC frame processing Relaying messages between EPC chip and Scheduler chip Supporting buffer size up to 2 M cells and up to 512 k frames Still referring to FIG. 2, the data flow chip includes memory arbiter 24, receive controller 26, EPC interface controller 28, transmitter controller 30, scheduler interface controller 32, buffer acceptance and accounting 34, buffers, arbiters, a plurality of DDR DRAMs (Slice 0-Slice N) and associated DRAM controllers. The name components are operatively coupled as shown in FIG. 2. The memory arbiter 24 receives write (W) commands on the conductor labeled W-request, read (R) commands on the conductor labeled R-request from the transmitter controller and read/write (R/W) request from the EPC interface controller on the conductor labeled R/W_request. The memory arbiter prioritizes the requests and provides access through DRAM controller 0-N to DDR DRAM memories labeled slice 0-N. In one embodiment of the present invention N was made equal to 5. As a consequence, the memory in this particular embodiment had six DDR DRAMs over which successive buffers of a frame are spread. While never using the same DDR DRAM for two consecutive buffers. In particular the portion of the memory occupied by each buffer is termed a Slice. Thus, buffer 0 is stored in Slice 0 of one DDR DRAM, buffer 1 is stored in Slice 1 of another DDR DRAM, buffer 2 is stored into Slice 2 of another DDR DRAM and so forth. It should be noted that any number of DDR DRAMs can be used without departing from the teachings of the present invention.

Referring to FIG. 1 for the moment, data buffers 16A and 16B are high speed buffers. In the implementation in FIG. 2 these high speed data buffers are provided from DDR DRAMs configured and managed in accordance with the teachings of the present invention. In particular, data in consecutive buffers are written into or read from blocks, termed Slices 0-N, in different memories. One of the functions of the memory arbiter is to move data from these memories so that the Bandwidth data-out at the FAT pipe port is approximately 10 gigabits per second. Other functions of the arbiter include placing data from consecutive buffers over different data store memories.

Turning again to FIG. 2, the data flow chip further includes scheduler interface controller 32 which is operatively coupled to the transmitter control 30 and buffer acceptance and accounting 34. Three QDR SRAMs labeled G-FIFO, TP/TB and BCB lists provide control information which is used by the memory arbiter and the transmitter controller. More than one device requires access to the TP/TB QDR SRAM and the BCB lists QDR SRAM. The FCB arbiter is coupled to provide access to TP/TB QDR SRAM and BCD arbiter provides access to the BCB lists QDR SRAM.

The G-FIFO QDR SRAM stores a linked list data structure that maintains a queue of frames awaiting dispatch to the EPC 12A/12B. When the Receiver Controller 26 completes reception of a frame from the Ingress Bus 18 or Switch Bus 21, it performs a write to the G-FIFO QDR SRAM to enqueue a frame on the tail of the queue. The EPC Interface Controller 28 performs a read of the G-FIFO QDR SRAM to dequeue a frame from the head of the queue for transmission to the EPC 12A/12B.

The TP/TB QDR SRAM stores linked list data structures that maintain queues of frames awaiting transmission by the Transmitter Controller 30. When the EPC 12A/12B or Scheduler 14B/16A enqueues a frame for transmission, the EPC Interface Controller 28 writes the TP/TB QDR SRAM to enqueue the frame to the tail of the appropriate Target Port (TP) or Target Blade (TB) queue. The Transmitter Controller 30 performs a read of the TP/TB QDR SRAM to dequeue a frame from the head of a TP or TB queue for transmission via Fat Pipe 22 or Switch Bus 20.

The BCB Lists QDR SRAM stores linked list data structures that form chains of buffer addresses. Buffers are chained for two purposes: First, buffers that contain frame data are linked together into buffer lists that form frames. Secondly, buffers which are not currently used to store data for a frame are queued in a linked list of free buffers. The Memory Arbiter 24 reads the BCB Lists QDR SRAM to obtain the address of free buffers from the head of the free queue list. When a frame arrives (via Ingress Bus 18 or Switch Bus 21), the Receiver Controller 26 requests one or more free buffer addresses as required per the size of the frame from the Memory Arbiter 24. The Receiver Controller 26 then uses the buffer addresses as the location in the DDR DRAM where the frame data is written. The Receiver Controller 26 also writes the BCB Lists QDR SRAM to record the linked list of buffers that form the frame. Upon frame transmission, the Transmitter Controller 30 reads the BCB Lists QDR SRAM to obtain the linked list of buffer addresses where the frame data is stored. It then reads the frame data from the buffer addresses in DDR DRAM and transmits the frame via the Fat Pipe 22 or Switch Bus 20. As frame data is read from the buffers in DDR DRAM, the Transmitter Controller 30 writes the corresponding buffer addresses to the tail of the free queue linked list stored in the BCB lists QDR. When a free buffer address reaches the head of the free queue linked list, the cycle repeats as the buffer address becomes available to be used again by the Memory Arbiter 24.

Still referring to FIG. 2, the EPC interface controller interfaces with the EPC interface. The EPC interface is the interface into the EPC (detail of which is described in the above-identified application). Also, the scheduler interface (inf) controller 32 interfaces with the scheduler interface. The scheduler interface is input into the scheduler chip (FIG. 1). It should be noted that the function identified on the lines interconnecting the functional block in the data flow chip are the functions generated by the block from which the line originates. By way of example, buffer control block (BCB) and frame control block (FCB) are released when appropriate signals are generated and outputted from the transmitter controller on the lines labeled release/chain BCB and FCB. Likewise, for chaining buffers in the TP/TB QDR SRAM a signal is generated by the EPC interface controller and outputted on the line labeled lease/chain FCB. This signal would cause identified buffers to be chained in the TP/TB SRAM.

Figure 3:
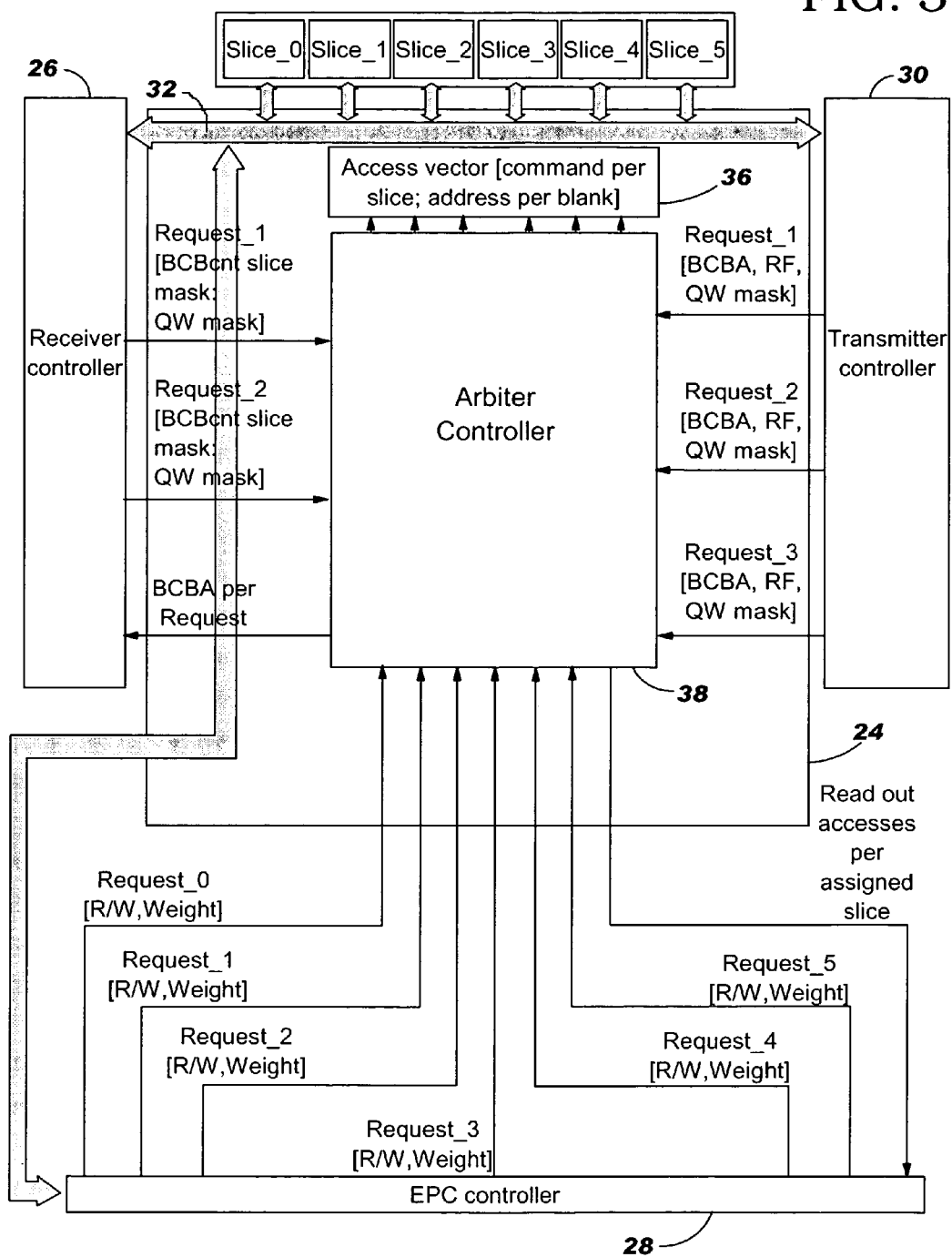
FIG. 3 shows functional block diagram of the Arbiter.

FIG. 3 shows a functional block diagram of the memory arbiter. One of the functions of the memory arbiter is to provide access to memory store slice 0 through slice N. In FIG. 3 N=5, but in general N can be any value selected by the designer and in no way limit the scope of the invention. For continuity and simplicity, elements in FIG. 3 that are common with elements in other figures are identified by the same numeral. The memory arbiter includes a bus structure 32 interconnecting the memory slices, receiver controller 26, EPC controller 28 and transmitter controller 30. An arbiter controller 38 generates access vector 36 that are used to access slices of the memory. The access vector format includes a command (read/write) per slice: an address of the bank that the command is to be executed in. The arbiter controller 38 may be designed as hardware logic, picoprocessor running picocode or state machine. The logic necessary to design the arbiter controller in hardware picocode or state machine is set forth below.

Still referring to FIG. 3, the arbiter controller 34 collects read/write requests from transmitter controller 30, receiver controller 26, and EPC controller 28 and schedules access towards individual memory store slices. The type of requests and structure of the requests from each of the named requesters are shown by arrows in FIG. 3. As will be discussed in detail below, the data store memory is organized in units of 64 bytes (equal buffers). Frame data are then written into different buffers sprayed over different slices in order to maximize use of memory BandWidth (BW).

In particular, receiver controller (FIG. 3) receives data from incoming data interfaces and issues write requests in order to write receive data into individual buffers of the memory store. Similarly, transmitter controller 30 issues read requests in order to transmit selected frame on outgoing interface. Receiver and transmitter controllers are two functional blocks whose functionally are determined by mode of operation of the data flow chip. These modes of operation can be line mode or switch mode. In line mode configuration receiver and transmitter controllers receive/transmit frames from/to line interface. In switch mode configuration, receiver and transmitter controllers receive/transmit PRIZMA cells from/to the switch interface. Typically, in Ingress direction receiver controller shall be configured in line mode and transmitter controller in switch mode. Similarly, in Egress direction receiver controller shall be configured in switch mode and transmit controller in line mode. In addition, line/line and switch/switch configurations can be supported.

Referring again to FIG. 2, the EPC controller terminates different messages from/to EPC and issues R/W requests to data store comprising of Slice 0 through Slice N. It also maintains track of frame waiting before processing in the QDR SRAM labeled G-FIFO (FIG. 2). Buffer acceptance and accounting 34 is responsible for queue/discard decision on per frame basis. It also maintains queue filling level on Target Blade/Target Port (TB/TP) basis and provides this information (metering information) to the switch fabric and switch interface. The BCB and FCB memory arbiter provides scheduling of different access for link list operation such as chain/dechain FCB or BCB, lease/release FCB or BCB.

Referring again to FIGS. 2 and 3, the buffers for storing information are provided by DDR DRAM memories identified as slice 0 through 5. As will be described hereinafter, each memory slice has its own memory interface bus of 32 bits at 166 mHz. Frame data is written into the data buffer in chunks of 64 bits equal of buffer. Each buffer contains four Quad Words (QWs) corresponding to four banks of DRAM. Hence, one buffer equals 4 QW equals 4×16 bytes of data. Each buffer of the data store memory is addressed by buffer control block address (BCBA). To each BCBA and hence each buffer in the data store corresponds one BCB entry in the BCB memory (QDR SRAM) containing all information related to data in that particular buffer and chaining pointer for following buffer in the frame (or free BCB queue). The access window (read or write of 64 bytes) on DDR-DRAM interface consumes 11 cycles, which means that aggregate throughput of one slice is about 7.75 Gbps. In order to provide support of 10 Gbps on the FAT pipe port or 14.3 Gbps on switch interface, the arbiter controller, in the arbiter, accesses multiple slices of memory simultaneously. As a consequence, the writing algorithm has to spray (i.e. write) buffers belonging to one frame over all slices in order to prevent collision and starving of the FAT pipe port. Likewise, data is read simultaneously from multiple slices of data.

As stated above the memory arbiter controls the access to individual slices of data memory. Baseline of such arbitration algorithm is as follows:
R/W access to one slice does not have to be interleaved, in other words there can be multiple subsequent R or W access to one slice.
R requests from transmitter controller have the highest priority; 1, 2 or 3 slices can be read at the same time simultaneously.
W accesses from receive controller have the second priority. One or two W requests can be granted at the same access window, obviously to different memory slices. The individual buffers belonging to one frame are sprayed over different memory slices. In essence adjoining parts of the same frame cannot be sprayed or written in the same memory slice. Instead, adjoining parts are written in different memory slices.
R/W requests from the EPC controller fills remaining opportunities within the access window to memory slice as well as complementing R and W access of transmitter and receiver at QW level. It should be noted that a QW is 16 bytes of data.

Still referring to FIG. 3, the main goal of the arbitration is to maintain an effective load of all memory slice interfaces as there is no room for idle cycles. The memory arbitration works in an 11-cycle window (one cycle=6 nanoseconds). At the start of the access window memory arbiter receives the following input requests to be scheduled in next window:

Transmitter requests are represented by the arrows shown in FIG. 3. Each request includes the BCB address (BCBA) of the buffer to be read; RF flag indicating if the buffer can be released and Quad Word (QW) mask complementing each BCB address. The QW mask indicates which QWs within this buffer must be effectively read. The unread QWs are used by the memory arbiter to complement access requests from EPC. There can be 0, 1, 2 or 3 requests from the transmitter controller in one window.

Receiver requests are characterized by slice exclusion masks and two QW masks. Two QW masks indirectly indicate how many buffers need to be located per request. For example, if one of the QW masks is '0000' it means only one buffer shall be allocated and which memory buffer QWs should be used in different buffers. Unused QWs shall be used by memory arbiter during complementation of the write request from EPC controller. The receiver controller is permitted to issue 0, 1 or 2 requests in one window.

EPC requests are represented by queues per slice, per action and per QW. The memory arbiter assigns all remaining slices based on weight of individual QW requests. This weight is proportional to age of the QW request expressed by 6-bit value. Moreover, memory arbiter can complement accesses of transmitter and receiver by reading corresponding QW access requests from EPC request queueing system.

In summary, any memory space that is not used by the transmitter controller or the receive controller during their respective access window is given to the EPC. This technique ensures that all memory spaces are used during an access window.

Still referring to FIG. 3, the arbiter controller 38 performs the following algorithm in order to construct buffer memory access vector for the next window:
Exclude slices scheduled for re-fresh cycle (indicated by each DRAM controller)
Assign slices for all R requests of Transmitter controller
Complement R-accesses from corresponding EPC queue [Slice;QW]
Assign slice to EPC for globally W excluded slices (e.g. slice is excluded by all slice exclusion rules from Receiver)
Assign slices to W requests in RR fashion between non-excluded slices starting from last assigned slice (slice assigned to Receiver Controller in previous window)
Complement W-accesses by EPC accesses from corresponding EPC queue [Slice;QW]
Assign slice to EPC requests according to priority expressed by Weight
Besides creating the access vector, Memory Arbiter has to perform also other functions such as:
assign BCBA for every Receiver request
assign re-fresh cycles for each of the memory slices on regular basis (simulations have proved that it shall be necessary to spread refresh cycles of the individual slices over 118 windows)
The output of the Memory Arbiter within each window is then as follows:
Access vector containing action per slice and address per QW
BCBA assigned for Receiver requests on per request basis Data retrieved from data store memory for previously granted Transmitter requests Confirmation on performed EPC requests to EPC controller Still referring to FIG. 3, the Receiver Controller 26 receives frames from an external bus interface and writes them into buffers in DDR DRAM. The external bus interface can be Ingress Bus 18 for ingress Dataflow 10A or Switch Bus 21 for egress Dataflow 10B, The Receiver Controller 26 issues requests to the Memory Arbiter 24 for addresses of free buffers in the DDR DRAM where the frame data can be written. The Memory Arbiter 24 responds with the requested free buffer addresses, and the Receiver Controller 26 writes the frame data to the specified buffer addresses in DDR DRAM. The Receiver Controller 26 also writes the BCB lists QDR SRAM to record the linked list of buffers that form the frame. When the entire frame has been stored in buffers in DDR DRAM, the Receiver Controller 26 writes the G-FIFO QDR SRAM to enqueue the frame onto the tail of the queue of frames awaiting dispatch to the EPC 12A/12B via the EPC Interface Controller 28.

Still referring to FIG. 3, the Transmitter Controller 30 reads frames from buffers in DDR DRAM and transmits them to an external bus interface which can be the Fat Pipe 22 for egress Dataflow 10B, or Switch Bus 21 for ingress Dataflow 10A. The TP/TB QDR SRAM stores linked list data structures that maintain queues of frames awaiting transmission by the Transmitter Controller 30. When the EPC 12A/12B or Scheduler 14B/16A enqueues a frame for transmission, the EPC Interface Controller 28 writes the TP/TB QDR SRAM to enqueue the frame to the tail of the appropriate Target Port (TP) or Target Blade (TB) queue. The Transmitter Controller 30 performs a read of the TP/TB QDR SRAM to dequeue a frame from the head of a TP or TB queue. It then reads the BCB Lists QDR SRAM to obtain the linked list of buffer addresses that form the frame. The Transmitter Controller 30 then reads the specified buffer addresses in DDR DRAM and transmits the frame data via Fat Pipe 22 or Switch Bus 20. As the data from each buffer is transmitted, the Transmitter Controller writes the BCB Lists QDR SRAM to place the buffer on the tail of the free queue buffer list.

Figure 4:
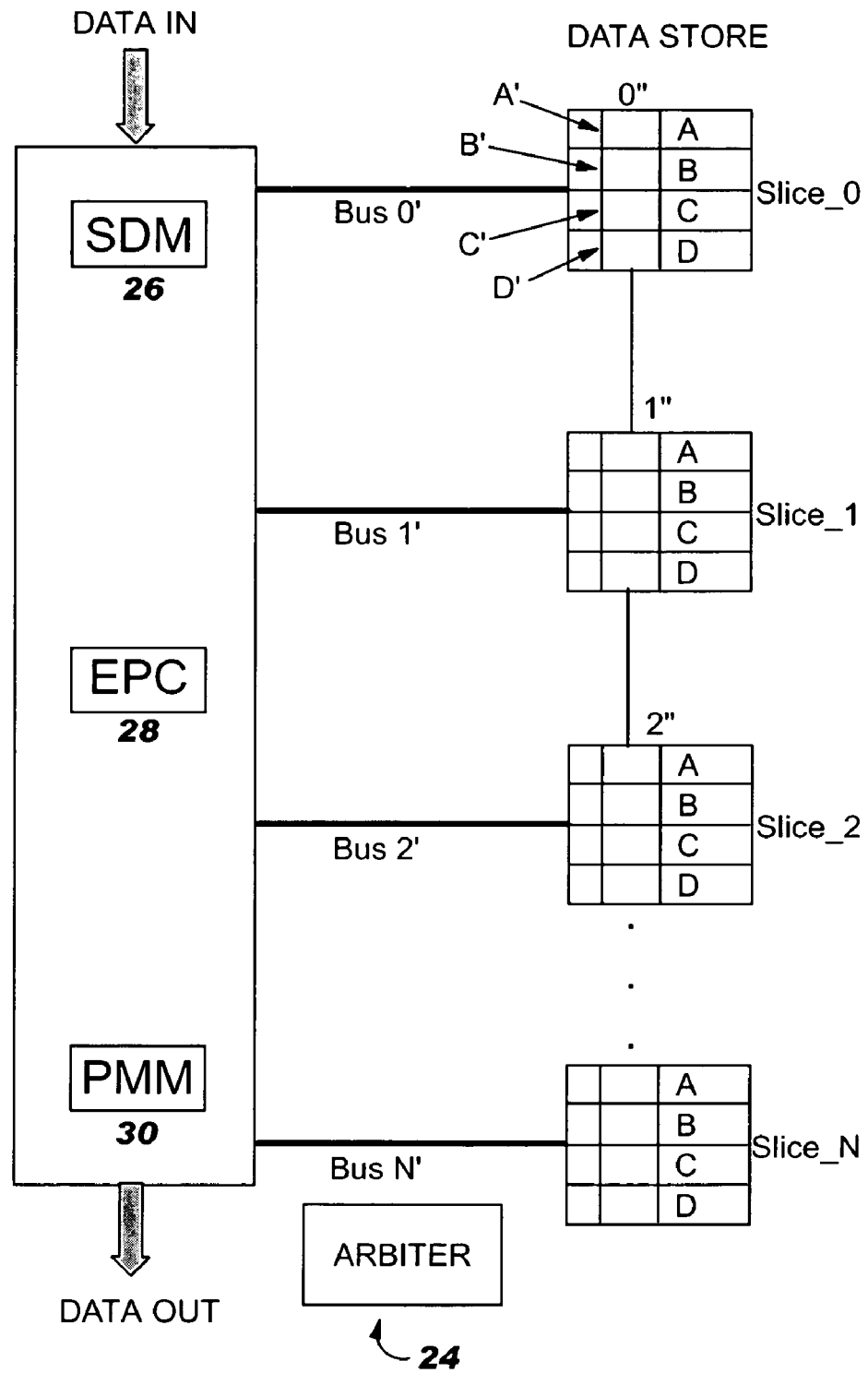
FIG. 4 shows functional details of the memory sub-system and interconnection to the Data Flow Chip.

FIG. 4 shows a functional representation of the data flow chip and the data store that provides data to the FAT pipe port coupled to the bus labeled data-out. For brevity, elements in FIG. 4 that are identical to previously named elements are identified by the same numeral. In light of this relationship receiver controller 26 (FIG. 2) is identified by acronym SDM. Likewise, EPC interface controller 28 (FIG. 2) is identified by acronym EPC and transmitter controller 30 (FIG. 2) is identified by acronym PMM.

As discussed previously, the SDM, EPC and PMM make requests to arbiter 24 which provides access to the data store. The data store includes individual DDR DRAMs labeled slice 0 through slice N. Each slice is connected by dedicated bus to the data flow chip. In particular, slice 0 is connected by bus 0'. Slice 1 is connected by bus 1'. Slice 2 is connected by bus 2' and slice N is connected by bus N'. It should be noted that N can be any value chosen by the designer. In FIG. 4 N is 4.

In one embodiment each of the buses 0' through N' are 32 bits wide and operate at the speed of 166 mHz. As a consequence, the throughput on each of the buses is approximately 7.75 Gbps. Each of the DDR DRAM such as slice 0, slice 1, slice 2 or slice N are partitioned into a plurality of buffers. In FIG. 4 one of the buffers in each slice is shown and are labeled buffer 0" 1" and 2". Each of the buffers span the four banks A through D that make up each slice of the data store. Each of the buffers 0" through N" are further divided into four smaller buffers labeled A' B' C' D' slice 0. Similar sub-partitions (not shown) are also used in the other slices of the data store. In one embodiment of the present invention the buffer 0", 1", etc. are 64 bytes whereas the smaller buffers A' B' C' D' are sometimes referred to as QWs are 16 bytes. As is evident in the figure, buffer 0' is made up of four QWs, each being 16 bytes in size.

Still referring to FIG. 4, the SDM writes data to memory buffers that has been received by the network processor. The PMM reads the data from memory that is to be transmitted by the FAT pipe port and the EPC accesses data in memory. The PMM is given highest priority when accessing memory followed by the SDM and finally the EPC. The arbiter 24 facilitates access to the data store based upon requests from the SDM, EPC and PMM. In particular the Arbiter 24 receives requests from the SDM, PMM and EPC, prioritizes the requests and grants memory access based upon the stated priority bases.

Figure 5:
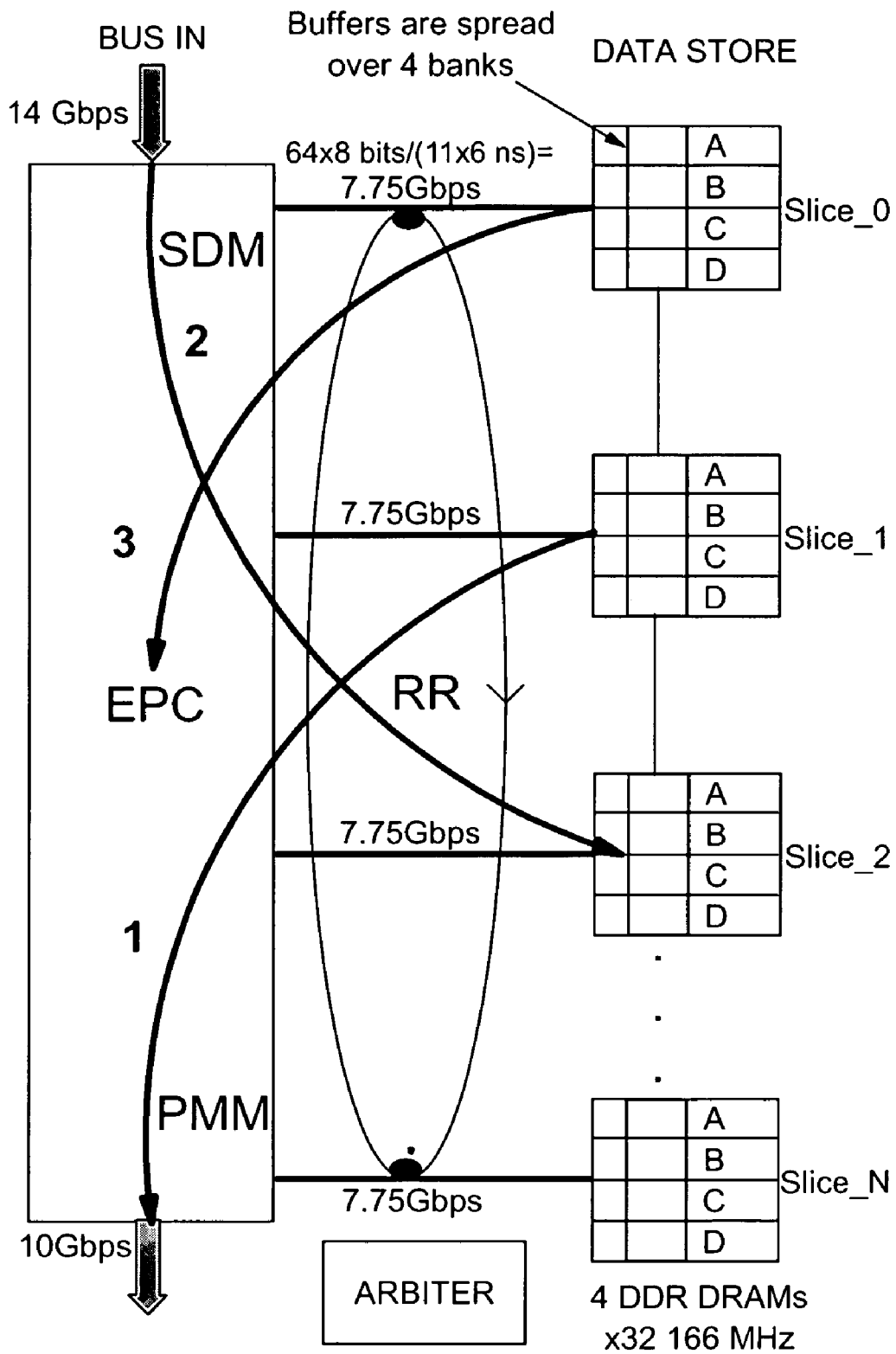
FIG. 5 shows graphical representation of segments of data frame being loaded and extracted from the memories.

FIG. 5 is a graphical representation of the priority assigned to the SDM, EPC or PMM when accessing memory. The PMM is shown to have the highest priority 1, followed by SDM priority 2 and EPC priority 3. The priority are only exemplary and should not limit the scope of the invention. The PMM reads buffers in any slice required. In FIG. 5 the PMM is reading a buffer in slice 1. If required, to satisfy the FAT port bandwidth, the PMM could also access, in parallel, all or any of the other slices such as slice 1, slice 2 or slice 3. Simultaneously, with the PPM reading slice 1, SDM is writing into slice 2 while EPC is reading from slice 0. Since each of the functional elements are accessing different slices in the memory, all of the named activities could occur in a single memory cycle.

Still referring to FIG. 5, as data is received via the Bus In it is stored in a FIFO buffer (not shown). When 64 bytes of data store memory are available one buffer (64 bytes) is written to a slice. In the preferred embodiment a round robin approach is used to write consecutive buffers of the same frame by the SDM into different slices. This technique of spreading data across slices on a per-frame basis guarantees that two consecutive buffers from the same frame are stored in different slices which in turn allows the PMM to efficiently read long frame from different memory slices.

Still referring to FIG. 5, when the PMM requires access to memory, it requires a bandwidth of approximately 10 Gbps. Any bandwidth less than the 10 Gbps (requirement of FAT pipe port) would cause corruption of data during transmission. To ensure the FAT Pipe port does not underrun a FIFO buffer (not shown) with bandwidth greater than that of the FAT Pipe port, in one embodiment approximately 15.5 Gbps, feeds the FAT port. To maintain the 10 Gbps bandwidth buffers are accessed in the data store and stored in the FIFO (not shown) at an average bandwidth of 10 Gbps. Each slice has a bandwidth of 32 bits. Each slice interfaces into a 64-bit bus (32-bit DDR physical interface to each memory, 64-bit internal bus inside the network processor after demultiplexing of the DDR bus).

Multiple slices at a time can be accessed in parallel. The Transmit Controller (FIG. 2) decides the statistical distribution of data to be read from the FIFO supporting the FAT port. This statistical distribution also ensures the port bandwidth requirement of 10 Gbps is satisfied. As stated previously, this implementation is possible based on the round robin (RR) technique used to guarantee that no two consecutive buffers of the same frame are stored in the same slice. For the case of short frames (i.e. frames that fit within one buffer) pre-buffering of the PMM FIFO is done to minimize the problem of potentially having to access two or more consecutive short frames stored in the same slice. Since this is statistical problem in nature, the FIFO buffer size can be chosen so as to minimize this potential problem (i.e. large FIFO, smaller chance of occurrence). The Transmit Controller (FIG. 2) uses the current filling level of the PMM FIFO to adapt the data rate thus preventing underrun condition at the FAT pipe port. If the FIFO is full, then no slice access is performed. If the FIFO has available space equal to or greater than one buffer (64 bytes in one embodiment) then one slice access is performed. If the FIFO has available space equal to or greater than two buffers, then two slice accesses are performed simultaneously.

Figure 6:
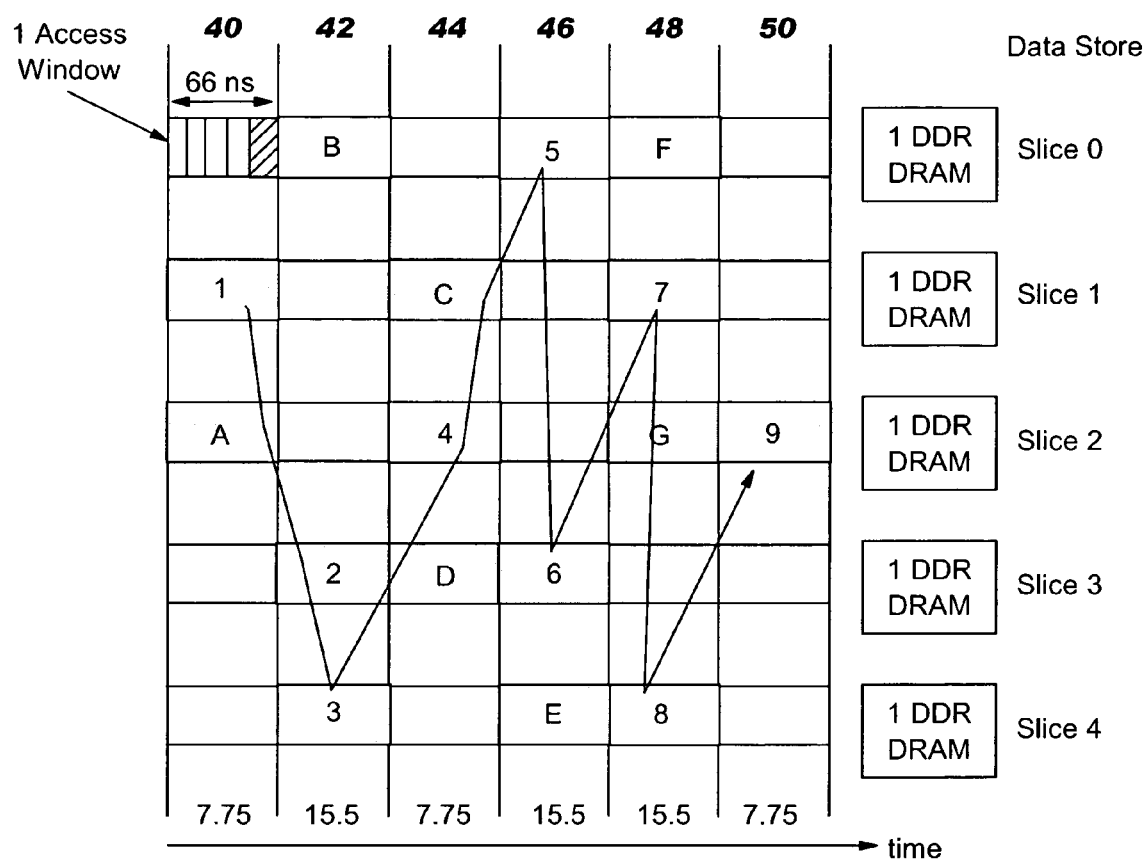
FIG. 6 shows a graphical representation of data writing interleaved with a frame being read from memory.

FIG. 6 shows a graphical representation of data writing being interleaved with a frame being read from memory. In the figure data store comprising of five DDR DRAMs labeled slice 0 through slice 4 are shown. Each of the squares represents a buffer in memory. Each access window is 66 nanoseconds and allows reading of all or any of the data store slices. Time is represented on the horizontal access as marked. The numerals such as 7.75, 15.5, etc., represent the bandwidth of data read out during each memory access window. The joined numerals 1 2 3 4 5 6 7 8 and 9 represent the frame which is being read out of memory at different memory windows. The alphabetical character indicates actions that are taken by other functions while the reading is being done in some of the memories. In particular, during the first access window 40, buffer 1 is read from slice 1 into the PMM FIFO. Next, the Transmit Controller (FIG. 2) calculates a need for two buffers and buffers 2 and 3 are read simultaneously from slice 3 and slice 4 during access window 42. During access window 44 buffer 4 is read from slice 2. During access window 46 buffers 5 and 6 are read simultaneously from slice 0 and slice 3. During access window 48 buffers 7 and 8 are read simultaneously from slice 1 and slice 4. Finally, during access window 50 the last buffer 9 is read from slice 2. The entire frame is read in six memory cycles from the five slices in the data store. The total bandwidth of the output data would be 10 Gbps. This is derived by summing the bandwidth of data outputted during each memory cycle. With reference to FIG. 6 the bandwidth outputted in each cycle are 7.75+15.5+7.75+15.5+15.5+7.75 divided by 6 equals 10 Gbps.

Still referring to FIG. 6, during the first access window 40, only one buffer is read in slice 1. Another function such as the SDM FIG. 5 or 6 can write block A in slice 2. Similarly, in access window 42 buffer B is read from slice 0 while buffers 2 and 3 are read in parallel from slices 3 and 4. Similarly, slices C and D are written into slice 1 and slice 3 simultaneously while buffer 4 is read from slice 2 and so on. In essence, while the high priority PMM is reading from selected memory slices unselected memory slices can be used by the EPC or the SDM. As a consequence, all memory cycles are interleaved to provide a more efficient usage of the memory. It should be noted that even though these memories are relatively slow, they have high store density. Therefore, by utilizing the teachings of this invention a large amount of data can be stored and extracted at high rate to supply a FAT pipe. The benefit of high density low cost memory to provide data flow to FAT pipe significantly reduces the cost of the storage. In addition, the present invention provides a unique memory system that provides a wide range of Bandwidth from relatively low to relatively high.

Although the present invention and its advantages and benefits have been described in detail, it should be understood that various changes, substitutions and alterations can be made herein without departing from the spirit and scope of the invention as defined by the appended claims.

What is claimed is:

1. A system including:
a Network Processor including at least one Data Flow Chip, at least one Embedded Processor Complex EPC chip, at least one Scheduler chip wherein the at least one EPC chip and the at least one Scheduler chip are operatively coupled to the at least one Data Flow Chip;
a plurality of memory elements with each one coupled by a separate bus to the at least one Data Flow Chip, wherein a bandwidth on each bus is 7.75 Gbps;
a first high speed data port that transmits data out of the Data Flow Chip, wherein a bandwidth of the high speed data port is 10 Gbps; and
an arbiter operatively coupled to the Data Flow Chip, said arbiter being responsive to Read (R) Requests to cause multiple ones of the bus to transmit data from associated memory elements simultaneously wherein the combined data bandwidth on the multiple ones of the bus is sufficient to meet Bandwidth requirements of the high speed port.

2. The system of claim 1 further including a second high speed data port that transmits data into the Data Flow Chip.

3. The system of claim 2 further including a Receiver Controller operatively coupled to the second high speed data port, said Receiver Controlling generating and providing Write (W) request signals to the arbiter; EPC Interface Controller, operatively coupled to the EPC chip, generating and providing Read(R)/Write(W) Request signals to the arbiter; and a transmitter controller, operatively coupled to the scheduler chip and the first high speed port, generating and providing the Read(R) Requests to said arbiter.

4. The system of claim 3 wherein the arbiter prioritizes the requests.

5. The system of claim 3 wherein priority 1, the highest, is assigned to the transmitter controller, priority 2, the second highest, is assigned to the Receive Controller and priority 3, the lowest, is assigned to the EPC controller.

6. The system of claim 3 wherein the arbiter includes circuit arrangement that allows access of the Receive Controller or the EPC Controller to memories not selected by the transmitter controller.

7. The system of claim 1 wherein the memory elements include N DDR DRAMs, N>1.

8. The system of claim 7 wherein each one of the N DDR DRAMs includes multiple banks.

9. The system of claim 8 wherein the each one of the N DDR DRAMs is partitioned into at least one buffer spreading across the multiple banks.

10. The system of claim 9 wherein the at least one buffer is further partitioned into smaller buffers.

11. The system of claim 10 wherein the at least one buffer is approximately 64 bytes and each one of the smaller buffers is approximately 16 bytes.

* * * * *